United States Patent
Jourdan et al.

(10) Patent No.: US 7,816,266 B2
(45) Date of Patent: Oct. 19, 2010

(54) COPPER DIFFUSION BARRIER

(75) Inventors: Nicolas Jourdan, Grenoble (FR);
Joaquin Torres, Saini Martin le Vinoux (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 216 days.

(21) Appl. No.: 11/867,708

(22) Filed: Oct. 5, 2007

(65) Prior Publication Data

US 2008/0280151 A1 Nov. 13, 2008

(30) Foreign Application Priority Data

Oct. 5, 2006 (EP) .................................. 06301019

(51) Int. Cl.
*H01L 21/44* (2006.01)
*H01L 21/441* (2006.01)
(52) U.S. Cl. ....................... 438/687; 438/638; 438/639; 257/E21.159
(58) Field of Classification Search .................. 438/687, 438/638, 639; 257/E21.159
See application file for complete search history.

(56) References Cited

U.S. PATENT DOCUMENTS

| | | | |
|---|---|---|---|
| 5,969,422 A * | 10/1999 | Ting et al. ................... | 257/762 |
| 6,043,153 A | 3/2000 | Nogami et al. | |
| 6,294,836 B1 | 9/2001 | Paranjpe et al. | |
| 7,452,812 B2 * | 11/2008 | Beyer et al. .................. | 438/687 |
| 2003/0201537 A1 | 10/2003 | Lane et al. | |
| 2007/0238294 A1* | 10/2007 | Beyer et al. .................. | 438/687 |
| 2008/0124924 A1* | 5/2008 | Naik .......................... | 438/675 |
| 2008/0254232 A1* | 10/2008 | Gordon et al. .............. | 427/585 |
| 2008/0280151 A1* | 11/2008 | Jourdan et al. .............. | 428/450 |
| 2008/0296768 A1* | 12/2008 | Chebiam et al. ............. | 257/751 |
| 2009/0102051 A1* | 4/2009 | Beyer et al. .................. | 257/751 |
| 2009/0152722 A1* | 6/2009 | Chang et al. ................. | 257/742 |
| 2009/0209099 A1* | 8/2009 | Yu et al. ...................... | 438/653 |

OTHER PUBLICATIONS

European Search Report from corresponding European Application No. 06301019, filed Oct. 5, 2006.

* cited by examiner

*Primary Examiner*—Mary Wilczewski
(74) *Attorney, Agent, or Firm*—Lisa K. Jorgenson; James H. Morris; Wolf, Greenfield & Sacks, P.C.

(57) ABSTRACT

The invention concerns a method of forming a copper portion surrounded by an insulating material in an integrated circuit structure, the insulating material being a first oxide, the method having steps including forming a composite material over a region of the insulating material where the copper portion is to be formed, the composite material having first and second materials, annealing such that the second material reacts with the insulating material to form a second oxide that provides a diffusion barrier to copper; and depositing a copper layer over the composite material by electrochemical deposition to form the copper portion.

17 Claims, 1 Drawing Sheet

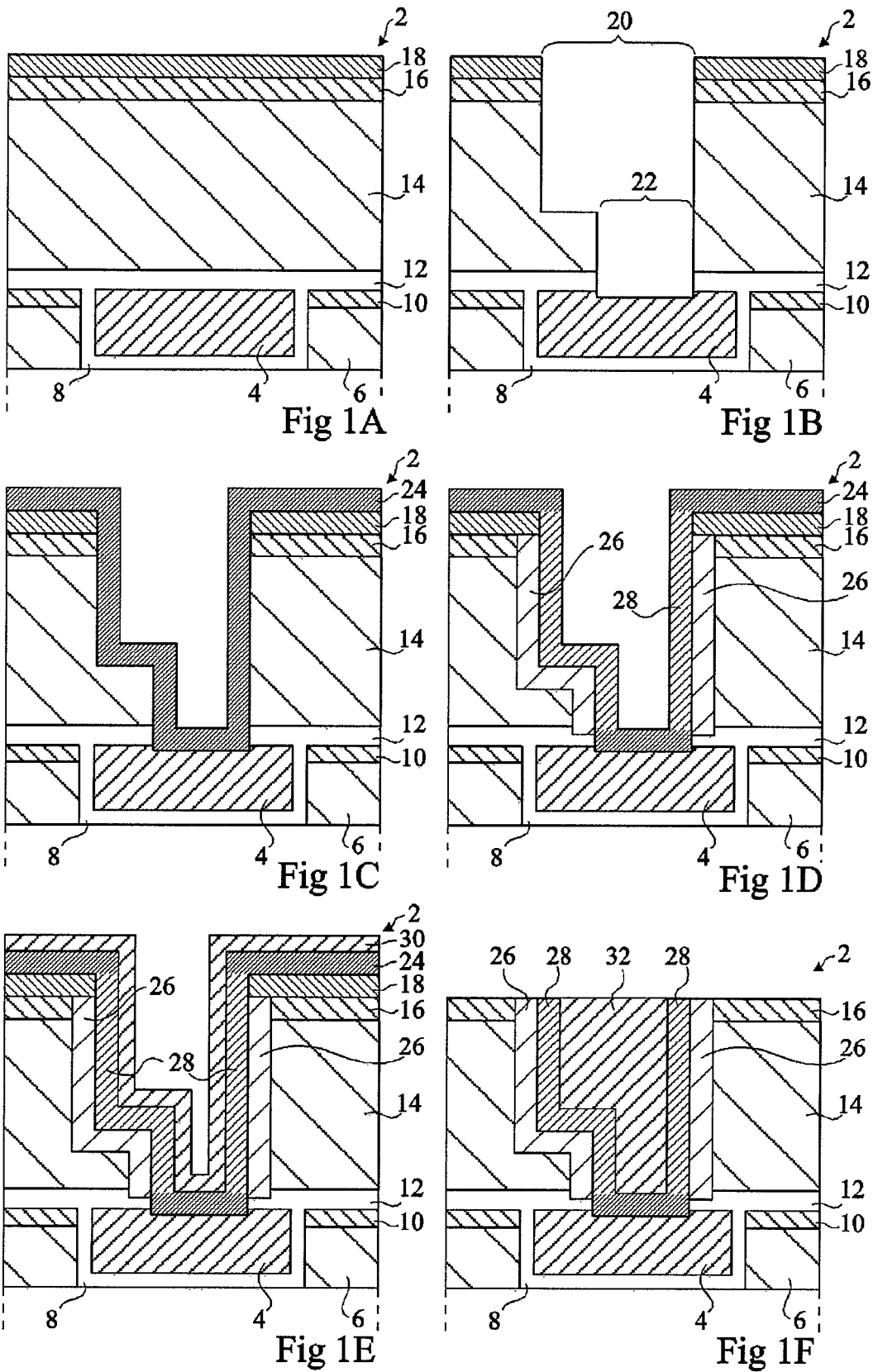

COPPER DIFFUSION BARRIER

BACKGROUND OF THE INVENTION

1. Field of the Invention

The present invention relates to the field of integrated circuit technology and in particular to a copper diffusion barrier and a method of forming the same.

2. Background of the Invention

When forming a copper portion in an insulating layer of an integrated circuit structure, for example a copper interconnect surrounded with an insulating layer, it is normal to provide a barrier between the copper and the insulating material to prevent diffusion of the copper during the lifetime of the integrated circuit. Generally, after a trench for the contact has been formed in the insulating layer, a barrier layer is deposited lining the trench. Materials such as tantalum or tantalum nitride are often used to form the barrier. This barrier is for example applied in a first deposition chamber using PVD (physical vapour deposition). The barrier is then covered by a copper seed layer in a second deposition chamber, also using PVD. The copper for forming the contact is then deposited in a further chamber, generally using ECD (Electrochemical deposition).

In some cases it is not possible to deposit the copper seed layer in a continuous layer. If the copper seed layer comprises gaps, this often results in voids forming in the copper contact, which generally add to the resistance of the contact, and can lead to complete failure of the contact.

SUMMARY OF THE INVENTION

It is one aim of the present invention to provide an improved method of forming a copper portion in an integrated circuit structure.

According to a first aspect of the present invention, there is provided a method of forming a copper portion surrounded by an insulating material in an integrated circuit structure, said insulating material being a first oxide, the method comprising: forming a composite material over a region of said insulating material where said copper portion is to be formed, said composite material comprising first and second materials; annealing such that said second material reacts with said insulating material to form a second oxide that provides a diffusion barrier to copper; and depositing a copper layer over said composite material by electrochemical deposition to form said copper portion.

According to one embodiment of the present invention, the method further comprises, before depositing said copper layer, depositing a copper seed layer over said composite material, said first material forming a copper seed repair layer.

According to one embodiment of the present invention, the annealing is performed in the presence of a vacuum or an inert gas.

According to one embodiment of the present invention, the composite material consists of the first and second materials.

According to one embodiment of the present invention, before said annealing step, the method comprises depositing a copper seed layer over said layer of composite material and either before or after said annealing step depositing a copper layer over the copper seed layer by electrochemical deposition.

According to some embodiments of the present invention, the composite material is an alloy and the first material is a noble metal.

According to some embodiments, said step of forming said composite material comprises depositing the alloy over the region of said insulating material where said copper portion is to be formed and in alternative embodiments comprises separately depositing said first and second materials over said region such that said alloy is formed over said region of said insulating material where said copper portion is to be formed.

According to further embodiments of the present invention, the first material is a metal selected from the list comprising ruthenium; platinum; and palladium and the second material is a metal selected from the list comprising manganese; titanium; tantalum; tungsten; and aluminium.

According to a further aspect of the present invention, there is provided an integrated circuit comprising a copper portion in a layer of insulating material, the insulating layer formed of an oxide, said copper portion and said insulating material being separated by a copper diffusion barrier consisting of a metal oxide and by a seed layer comprising a noble metal.

According to some embodiments of the present invention, the insulating layer and said copper diffusion barrier each comprise silicon oxide.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings.

FIGS. 1A to 1F illustrate steps in a method for forming a copper contact according to an embodiment of the present invention.

DETAILED DESCRIPTION

Assuming that a copper layer is to be formed in a trench lined with a tantalum copper diffusion barrier and a copper seed layer, for the ECD process used for depositing the copper of the copper layer to work well, it is desirable that there is a continuous conducting layer over the whole of the surface that is to be covered by the copper layer. However, it is generally difficult to deposit a continuous copper seed layer covering the whole surface of the copper diffusion barrier, and occasionally there are gaps. Such gaps expose regions of the tantalum barrier. During transfer of the wafer to the ECD chamber, the integrated circuit structure is exposed to the atmosphere, resulting in the tantalum oxidizing with the air to form tantalum oxide which is an insulator. Non-conducting regions are thereby formed in the copper seed layer, which results in voids being forming in the copper layer during ECD, and such voids often lead to failure of the contact.

A solution that has been proposed is to deposit a seed repair layer, for example of ruthenium, before depositing the seed layer. Thus if the copper seed layer is not continuous, ruthenium will be exposed, and not the tantalum of the barrier layer. Ruthenium is both a good conductor, and a material that does not easily oxidize in air. Furthermore, even if the ruthenium did oxidize, ruthenium oxide is also a conductor. Therefore, the conducting layer remains continuous despite gaps in the copper seed layer. Such a solution has some drawbacks such as generally requiring an extra deposition step and an additional deposition chamber when compared to a copper portion formed without a seed repair layer.

An example of the method according to the present invention will now be described with reference to FIGS. 1A to 1F.

With reference to FIG. 1A, a cross-section view of part of an integrated circuit structure 2 is illustrated, in which a copper plate 4 has been formed, for example providing a contact for a transistor gate, capacitor plate or the like (not shown in the figures). The copper plate 4 has been formed in a trench in an insulating layer 6. The insulating layer 6 is for example formed of PULk (porous ultra-low k) material, comprising silicon oxide, and the trench is lined with a layer 8 of SiCN forming a barrier. This layer can be either a metallic barrier formed for example of a material such as TaN, or alternatively can be an oxide-based material formed in the same manner as the copper diffusion barrier that will be described in more detail below.

Part of a hard mask layer 10, for example formed of $SiO_2$, is shown on either side of the copper plate 4, this hard mask being used in the formation of the trench. Layer 10 and the copper plate 4 have been covered by a further layer 12 of SiCN, forming a dielectric barrier. A further insulating layer 14 has been formed over the dielectric barrier 12, also formed for example of PULk, and a further layer 16 of $SiO_2$ and a layer of TiN have been deposited over the insulating layer.

It is desired to form a copper interconnect through the insulating layer 14 to make a connection with copper plate 4. The method steps for forming such an interconnect will now be described with reference to FIGS. 1B to 1F.

FIG. 1B illustrates steps in which a trench 20 is formed, aligned with the copper plate 4, that passes through the TiN layer 18, the $SiO_2$ layer 16 and partway through the insulating layer 14. Trench 22 is for example formed by photolithography and etching steps. Next a trench 22 is formed which in this case is slightly narrower than trench 20, and extends from the bottom of trench 20 to the top surface of copper plate 4. Again trench 22 is for example formed by a process comprising photolithography and etching.

In this example, trench 20 is a relatively long trench used for forming a copper track between components in the integrated circuit structure 2, whereas trench 22 is a hole connecting trench 20 to the top of the copper plate 4 and thus allowing a copper track formed in trench 20 to be connected to copper plate 4.

FIG. 1C illustrates a subsequent step in which a layer 24 of a composite material, in this case a metal alloy comprising RuMn, is formed over the integrated circuit structure 2, lining trenches 20, 22, and covering the TiN layer 18. This formation step is for example performed by depositing the RuMn alloy as a single target by PVD in a first deposition chamber. Alternatively, pure Ru and pure Mn are deposited as separate targets at the same time, such that an alloy or composition of these metals is formed on the integrated circuit structure 2. Layer 24 is for example in the range of 5 nm to 200 nm in thickness.

FIG. 1D illustrates a next step in which annealing is performed, such that a reaction occurs between the RuMn alloy and the $SiO_2$ of the PULk insulating layer 14 and hard mask 16. In particular, the manganese reacts with the silicon oxide to form a $MnSi_xO_y$ layer, where x and y are the respective number of silicon and oxygen atoms. $MnSi_xO_y$ is formed at the edges of the PULk layer 14 and $SiO_2$ layer 16 at the interface with RuMn alloy 24, as shown by the regions labelled 26 in the FIG. 1D. This leaves the ruthenium, and any traces of manganese that have not migrated to form the barrier, in the layer which remains as shown in FIG. 1D labelled 28. Ruthenium does form an oxide with the insulating layer. Annealing processes for forming MnSixoy are for example discussed in more detail in the paper entitled "Growth behaviour of self-formed barrier using Cu—Mn alloys at 350 to 600° C.", by J. Iijima et al. (IEEE 2006), which will be considered as known, and is hereby incorporated by reference. The annealing process is for example performed in an oven at between 200 to 500° C., and for a period of between a few minutes and 100 hours, depending on various factors such as the dimensions of the structure, the particular materials used, etc. Annealing is performed in a neutral atmosphere, meaning either in a vacuum, or in the presence of an inert gas such as Argon, to prevent oxidization of the manganese with the atmosphere.

By way of example, the layer 24 of composite material has a thickness of 50 nm and annealing is performed at 400° C. for a period of 10 hours.

After annealing, the diffusion barrier that has formed for example has a thickness of between 3 nm and 30 nm, while the remaining layer of ruthenium for example has a thickness of between 3 nm and 100 nm. The relative quantities of ruthenium and manganese in the composite layer 24 are chosen such that after annealing, there is enough manganese that has reacted with the silicon oxide insulating material to form an effective copper diffusion barrier, and there is enough ruthenium to form an effective seed layer for subsequent copper deposition or a seed repair layer for a subsequent copper seed layer. For example, ruthenium accounts for between 5 and 95 percent of the composite layer, but preferably approximately 40 to 60 percent.

FIG. 1E illustrates a subsequent step in which a copper seed layer 30 is deposited in a second deposition chamber by PVD. The copper seed layer for example comprises copper, but in alternative embodiments the copper seed layer could be formed of another metal or metal alloy, for example a copper alloy. In alternative embodiments, no copper seed layer is provided, the ruthenium layer itself providing a seed layer for subsequent copper deposition by ECD. In such cases, the ruthenium layer is for example at least 10 nm in thickness.

As shown in FIG. 1F, copper is then deposited by electroplating. In particular, ECD is performed, depositing a copper layer 32 that fills the trenches 20, 22. ECD is for example performed in a separate deposition chamber to the deposition of the composite layer 24. Chemical mechanical polishing (CMP) is then used to remove excess copper from layer 32, and to remove the TiN layer 18, providing a flat top surface to the structure ready, for example for further contacts to be formed.

Thus, as described above, by depositing a composite material in one deposition step, and then performing an annealing process, it is possible to form both a copper diffusion barrier for preventing copper diffusion, as well as a seed layer/seed repair layer. In the above example, the copper diffusion barrier is provided by the layer of $MnSi_xO_y$, which has been found to provide a very good barrier. The seed layer/seed repair layer in the above example is formed by the ruthenium left after the manganese from the RuMn alloy has migrated into the insulating layer. Advantageously ruthenium is a good conductor and does not easily oxidize in air, and thus the seed repair layer provides a continuous conducting layer even if exposed to the atmosphere. Furthermore, as the formation of the copper diffusion barrier and seed repair layer requires only a single deposition, only a single deposition chamber is required for this step.

Another advantage of providing a single layer for both the seed layer/seed repair layer and the copper diffusion barrier is that oxidization during the annealing step does not occur in the region of the underlying copper plate, and therefore the resistance of the overall interconnect is minimized. In particular, there are now only two interfaces between the copper plate 4 and the copper contact: a first interface between the copper of the copper plate 4 and RuMn, and a second interface between RuMn and copper layer 32. Both of these interfaces have relatively low resistance.

Another advantage of depositing only a single layer for forming both the seed layer/seed repair layer and the copper diffusion barrier is that this layer can be thinner and therefore a larger percentage of the trench width is formed of copper when compared to contacts having a copper diffusion barrier and a seed repair layer deposited separately.

It will be apparent to those skilled in the art that while one example of a method of forming a contact has been described, there are many alternatives that can be used.

For example, while the annealing step has been described as being performed directly after the metal alloy 24 has been deposited, annealing can alternatively be performed after the copper seed layer 30 has been deposited, or after the copper layer 32 has been deposited by electrochemical deposition. The latter is possible because the metal alloy, in the above example formed of RuMn, can contain relatively low quantities of Mn such that the RuMn alloy has characteristics in terms of oxidization and resistivity very close to pure Ru. Therefore the RuMn alloy does not oxidize easily in air and is therefore an effective seed repair layer even before the manganese has been separated to form the copper diffusion barrier.

While the use of an RuMn alloy has been described, alternative materials can be used to form the composite material having similar properties, and thus without losing the advantages described above. In particular, manganese can be replaced by other materials that will form a stable oxide and provide an effective barrier to copper. Such alternative materials for example include Mg, Ti, Ta, W and Al. Furthermore, ruthenium can be replaced in alternative embodiments by an alternative material that provides a good seed layer/seed repair layer, in other words a material that does not oxidize, or does not oxidize easily in air. Such materials are for example noble metals. Noble metals are relatively resistant to oxidization and erosion, and include metals such as platinum, palladium, silver and gold.

While in the above example the insulating layer 14 has been described as comprising a PULk material, in other embodiments alternative materials can be used, for example materials comprising silicon oxide, such as SiCOH.

Furthermore, while an example of forming a copper contact has been described, it will be apparent to those skilled in the art that the process described herein can be used to for forming any copper portion of an integrated circuit structure in which there is an interface between the copper and an insulating material for which a copper diffusion barrier and a seed repair layer are required. Examples of such copper portions include for example capacitor plates, MOS transistor gate, source or drain contacts, vias, etc.

Having thus described at least one illustrative embodiment of the invention, various alterations, modifications and improvements will readily occur to those skilled in the art. The foregoing description is by way of example only and is not intended to be limiting. The invention is limited only as defined in the following claims and the equivalent thereto.

The invention claimed is:

1. A method of forming a copper portion surrounded by an insulating material in an integrated circuit structure, said insulating material being a first oxide, the method comprising:
    forming a composite material over a region of said insulating material where said copper portion is to be formed, said composite material being free of copper and comprising first and second materials;
    annealing such that said second material from the composite material reacts with said insulating material to form a second oxide that provides a diffusion barrier to copper;
    depositing a copper seed layer over said composite material, said first material forming a copper seed repair layer; and
    after depositing the copper seed layer, depositing a copper layer over said composite material by electrochemical deposition to form said copper portion.

2. The method of claim 1, wherein said annealing is performed in the presence of a vacuum or an inert gas.

3. The method of any of claims 1, wherein said composite material consists of said first and second materials.

4. The method of claim 1, wherein said composite material is an alloy and wherein said first material is a noble metal.

5. The method of claim 4, wherein said step of forming said composite material comprises depositing said alloy over said region of said insulating material where said copper portion is to be formed.

6. The method of claim 4, wherein said step of forming said composite material comprises separately depositing said first and second materials over said region such that said alloy is formed over said region of said insulating material where said copper portion is to be formed.

7. The method of claim 4, wherein said first material comprises at least one metal selected from the list comprising:
    ruthenium;
    platinum; and
    palladium.

8. The method of claim 1, wherein said composite material is a metal alloy and wherein said second material comprises at least one metal selected from the list comprising:
    manganese;
    titanium;
    tantalum;
    tungsten; and
    aluminium.

9. A method of forming a copper diffusion barrier and a copper seed layer for separating a copper portion and an insulating material of an integrated circuit structure, the method comprising:
    positioning an integrated circuit structure into a deposition chamber, the integrated circuit structure including a copper plate and an insulating material over the copper plate;
    forming a trench through the insulating material and to the copper plate;
    depositing a composite material over the insulating material and the copper plate, the composite material being free of copper and including a first material;
    annealing the composite material in the deposition chamber to form a copper diffusion barrier; and
    depositing a copper seed layer over the composite material, the first material forming a copper seed repair layer.

10. The method of claim 9, further comprising:
    depositing the copper portion over the composite material by electrochemical deposition in another deposition chamber.

11. The method of claim 9, wherein annealing is performed in the presence of a vacuum or an inert gas.

12. The method of claim 9, wherein the composite material further includes a second material.

13. The method of claim 12, wherein the composite material is an alloy and wherein the first material is a noble metal.

14. The method of claim 13, wherein forming the composite material comprises depositing the alloy over the insulating material where said copper portion is to be formed.

15. The method of claim 12, wherein the first material comprises at least one metal selected from the group consisting of:

ruthenium;
platinum; and
palladium.

16. The method of claim 15, wherein the composite material is a metal alloy and wherein the second material comprises at least one metal selected from the group consisting of:
manganese;
titanium;
tantalum;
tungsten; and
aluminium.

17. The method of claim 12, wherein depositing the composite material comprises separately depositing the first and second materials over the insulating material and the copper plate where the copper portion is to be formed.

* * * * *